United States Patent
Campbell et al.

(10) Patent No.: US 7,788,941 B2
(45) Date of Patent: Sep. 7, 2010

(54) COOLING SYSTEM AND METHOD UTILIZING THERMAL CAPACITOR UNIT(S) FOR ENHANCED THERMAL ENERGY TRANSFER EFFICIENCY

(75) Inventors: Levi A. Campbell, Poughkeepsie, NY (US); Richard C. Chu, Hopewell Junction, NY (US); Michael J. Ellsworth, Jr., Lagrangeville, NY (US); Madhusudan K. Iyengar, Woodstock, NY (US); Robert E. Simons, Pouhkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 349 days.

(21) Appl. No.: 11/762,822

(22) Filed: Jun. 14, 2007

(65) Prior Publication Data
US 2008/0307806 A1 Dec. 18, 2008

(51) Int. Cl.
*F25D 23/12* (2006.01)
(52) U.S. Cl. .......................... 62/259.2; 62/434; 62/435; 62/185
(58) Field of Classification Search ............... 62/259.2, 62/434, 435, 185
See application file for complete search history.

(56) References Cited

U.S. PATENT DOCUMENTS

| | | | |
|---|---|---|---|
| 4,313,310 A * | 2/1982 | Kobayashi et al. | ............ 62/175 |
| 4,831,830 A | 5/1989 | Swenson | |
| 5,860,280 A | 1/1999 | Recine, Sr. et al. | |
| 5,963,458 A | 10/1999 | Cascia | |
| 6,397,618 B1 | 6/2002 | Chu et al. | |
| 7,086,247 B2 | 8/2006 | Campbell et al. | |
| 2003/0014987 A1* | 1/2003 | Levenduski et al. | ........... 62/185 |
| 2005/0122685 A1 | 6/2005 | Chu et al. | |

(Continued)

FOREIGN PATENT DOCUMENTS

DE 29903863 U1 11/1999

(Continued)

OTHER PUBLICATIONS

Machine translation (description) DE19903743 Aug. 3, 2000.*

(Continued)

*Primary Examiner*—Cheryl J Tyler
*Assistant Examiner*—Jonathan Koagel
(74) *Attorney, Agent, or Firm*—Geraldine Monteleone, Esq.; Kevin P. Radigan, Esq.; Heslin Rothenberg Farley & Mesiti P.C.

(57) ABSTRACT

A cooling system and method are provided which include a facility cooling unit, a cooling tower, and one or more thermal capacitor units. The facility cooling unit, which includes a heat dissipation coolant loop, facilitates thermal energy extraction from a facility, such as a data center, for expelling of the energy to coolant within the heat dissipation coolant loop. The cooling tower is in fluid communication with the coolant loop, and includes a liquid-to-air heat exchanger for expelling thermal energy from coolant of the heat dissipation coolant loop to the surrounding environment. The thermal capacitor unit is in fluid communication with the heat dissipation coolant loop to facilitate efficient thermal energy transfer from coolant with in the coolant loop to the surrounding environment with variation in ambient temperature about the cooling tower.

14 Claims, 8 Drawing Sheets

U.S. PATENT DOCUMENTS

2005/0262870 A1 12/2005 Narayanamurthy et al.
2006/0042289 A1* 3/2006 Campbell et al. .......... 62/259.2

FOREIGN PATENT DOCUMENTS

| DE | 19903743 | A1 | 8/2000 |
| EP | 0025665 | A | 3/1981 |
| EP | 1031808 | A2 | 8/2000 |
| JP | 10223442 | A | 8/1998 |
| JP | 2008014563 | A | 1/2008 |

OTHER PUBLICATIONS

International Search Report and Written Opinion from International Application No. PCT/EP2008/055758 completed Oct. 9, 2008 and mailed on Oct. 29, 2008.

* cited by examiner

US 7,788,941 B2

COOLING SYSTEM AND METHOD UTILIZING THERMAL CAPACITOR UNIT(S) FOR ENHANCED THERMAL ENERGY TRANSFER EFFICIENCY

TECHNICAL FIELD OF THE INVENTION

The present invention relates in general to cooling systems and methods, and more particularly, to cooling systems and methods for dissipating thermal energy from a facility such as a data center comprising one or more electronics racks. Still more particularly, the present invention relates to cooling systems and methods employing one or more thermal capacitor units for passively or actively maintaining coolant in a heat dissipation coolant loop within a defined range for a period of time with variation in ambient temperature about a cooling tower through which thermal energy of the coolant is dissipated.

BACKGROUND OF THE INVENTION

Cooling of data centers, as well as office complexes and manufacturing facilities, is typically achieved by coupling, for example, a vapor-compression refrigeration system to a heat dissipation coolant loop, such as a chilled water circulation loop. The ultimate heat rejection sink for the vapor-compression refrigeration system may be a river, lake, ocean or the surrounding air. When an air-cooled cooling tower is employed, efficiency of heat transfer to the surrounding environment depends on the ambient temperature about the tower. For example, while an air conditioning load in a data center is relatively constant over time (e.g., day and night operation is common), efficiency of the vapor-compression refrigeration system decreases with increasing ambient temperature. Undesirably, the efficiency of the cooling system is thus low during the day, when the data center, office or manufacturing floor air conditioning demands are the highest, and is relatively higher at night, when the air conditioning demands are the lowest.

Thus, there is a need in the art for a cooling system and method which enhances thermal energy transfer efficiency with variation in ambient temperature about, for example, a cooling tower.

SUMMARY OF THE INVENTION

The shortcomings of the prior art overcome and additional advantages are provided through the provision of an enhanced cooling system. This cooling system includes at least one facility cooling unit, a cooling tower and at least one thermal capacitor unit. The at least one facility cooling unit includes a heat dissipation coolant loop. When operational, facility thermal energy is extracted by the at least one facility cooling unit and expelled to coolant within the heat dissipation coolant loop. The cooling tower is in fluid communication with the heat dissipation coolant loop and includes a liquid-to-air heat exchanger for expelling thermal energy from coolant of the heat dissipation coolant loop to the surrounding environment. The at least one thermal capacitor unit is also in fluid communication with the heat dissipation coolant loop to facilitate efficient thermal energy transfer from coolant of the heat dissipation coolant loop to the surrounding environment with variation in ambient temperature about the cooling tower.

In another aspect, a cooled electronics system is provided which includes at least one electronics rack comprising at least one electronics unit, and a cooling system. The cooling system includes at least one facility cooling unit, a cooling tower and at least one thermal capacitor unit. The facility cooling unit includes a heat dissipation coolant loop. When operational, the facility cooling unit facilitates extracting thermal energy from the at least one electronics unit of the at least one electronics rack and expels the extracted thermal energy to coolant of the heat dissipation coolant loop. The cooling tower is in fluid communication with the heat dissipation coolant loop and includes a liquid-to-air heat exchanger for expelling thermal energy from coolant of the heat dissipation coolant loop to the surrounding environment. The at least one thermal capacitor unit is also in fluid communication with the heat dissipation coolant loop to facilitate efficient thermal energy transfer from coolant of the heat dissipation coolant loop to the surrounding environment with variation in ambient temperature about the cooling tower.

In a further aspect, a method of cooling a facility is disclosed. This method includes: providing at least one facility cooling unit comprising a heat dissipation coolant loop, wherein when in use, the at least one facility cooling unit extracts thermal energy from the facility and expels the thermal energy to coolant of the heat dissipation coolant loop; providing a cooling tower in fluid communication with the heat dissipation coolant loop, the cooling tower including a liquid-to-air heat exchanger for expelling thermal energy from coolant of the heat dissipation coolant loop to the surrounding environment; and providing at least one thermal capacitor unit in fluid communication with the heat dissipation coolant loop to facilitate efficient thermal energy transfer from the coolant of the heat dissipation coolant loop to the surrounding environment with variation in ambient temperature about the cooling tower.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics drawers each having one or more heat generating components disposed therein requiring cooling. Further, as used herein, "liquid-to-air heat exchange unit" or "liquid-to-air heat exchanger" means any heat exchange mechanism characterized as described herein through which liquid coolant can circulate; and includes, one or more discrete liquid-to-air heat exchangers coupled either in series or in parallel. A liquid-to-air heat exchanger may comprise, for example, one or more coolant flow paths, formed of thermally conductive tubing (such as copper or other tubing) in thermal or mechanical contact with a plurality of air-cooled cooling fins. Additionally, size, configuration and construction of the liquid-to-air heat unit can vary without departing from the scope of the present invention.

Additionally, as used herein, "data center" refers to a computer installation containing one or more electronics racks to be cooled. As a specific example, a data center may include one or more rows of rack-mounted computing units, such as server units. In addition, the systems and methods are described herein with reference to a generic "coolant". In one embodiment, the coolant may comprise a water-based, two-phase coolant (such as used in evaporative water cooling towers). However, the concepts disclosed are readily adapted to use with other types of coolant, either two-phase or single-phase. For example, the coolant may comprise a brine, a fluorocarbon liquid, a liquid metal, or other similar coolant, or a refrigerant, while still maintaining the advantages and unique features of the present invention. The "facility cooling unit" refers to either an air-conditioning unit, such as employed in a conventional vapor-compression refrigeration system, or a liquid-cooled coolant distribution unit, such as described, for example, in United States Letters Patent No. U.S. Pat. No. 7,086,247.

Reference is made below to the drawings, which are not drawn to scale and which are simplified for ease of understanding. The same reference numbers used throughout different figures designate the same or similar components.

Advances in semiconductor technology have led to an exponential increase in processor performance over the last few years. This in turn has led to a steep increase in the node, rack and cluster power consumption, leading to a corresponding rise in the energy needs of the air-cooling HVAC equipment used for thermal management in a typical data center.

Figure 1:
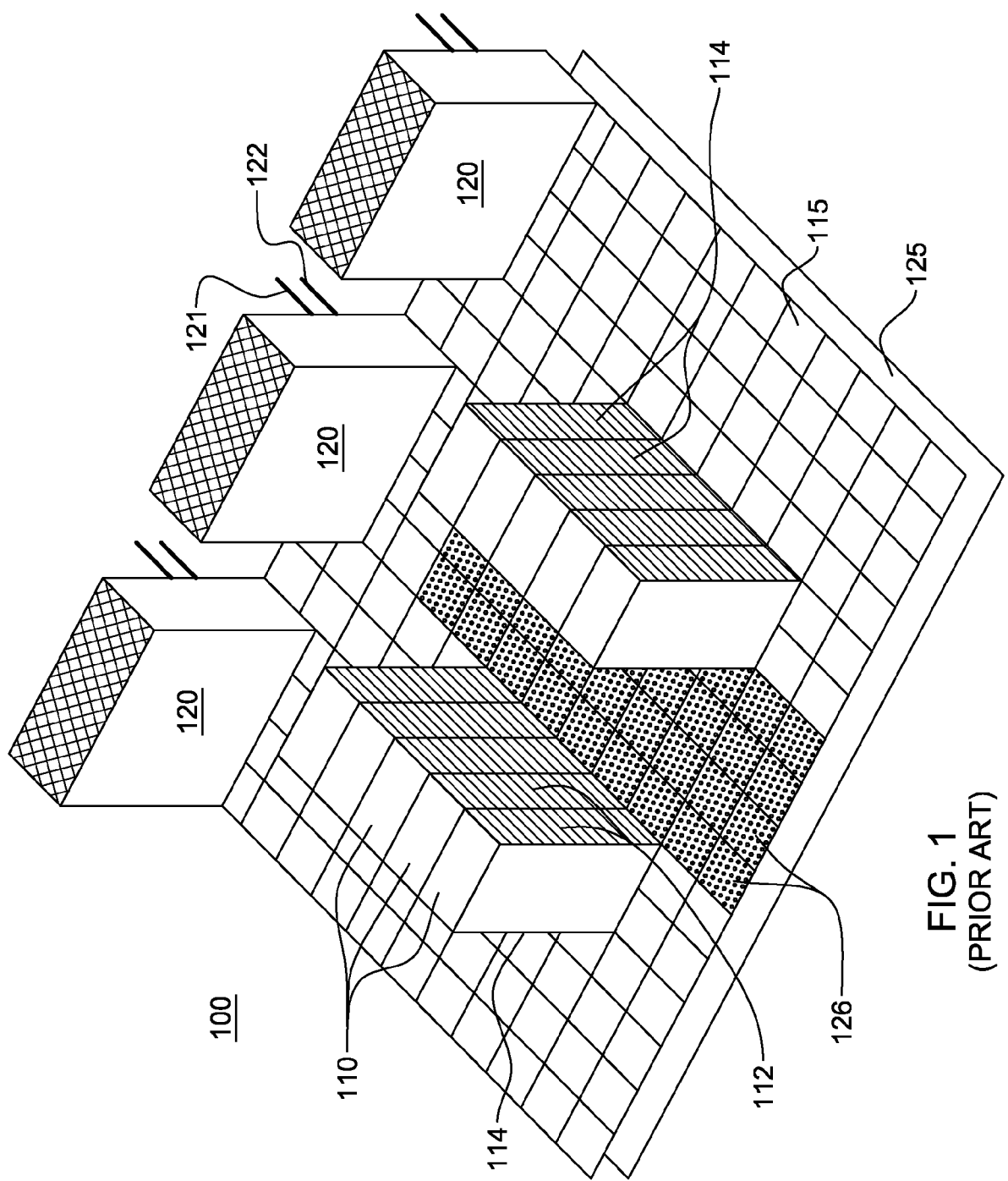
FIG. 1 depicts one embodiment of a conventional raised floor layout of an air-cooled data center.

FIG. 1 illustrates one embodiment of an air-cooled data center, generally denoted 100, wherein a plurality of electronics racks 110 are disposed in multiple rows on a raised floor region 115 of the data center. Within air-conditioning units 120, air-to-liquid heat exchangers cool the room's ambient air transferring heat therefrom to facility coolant passing through the air-conditioning units 120, which are shown connected to coolant inlet line 121 and coolant outlet line 122. In data center 100, electronics racks 110 are aligned in rows with air inlet sides 112 of the racks disposed adjacent to perforated tiles 126, which allow cool air to be drawn into the inlet sides of the electronics racks from an under-floor plenum 125 of raised floor region 115. Heat is exhausted out the air outlet sides 114 of the electronics racks into the data center environment. Typically, the electronics racks include one or more air moving devices which facilitate the ingress and egress of air flow from the air inlet side to the air outlet side thereof. Heat expelled into the data center environment exits through the air-conditioning units 120 and the heat dissipation coolant loops (i.e., coolant inlet and outline lines 121, 122) coupled thereto.

In an alternate approach, a coolant distribution unit is employed implementing a liquid-cooled data center. One embodiment of such a cooling distribution unit, generally denoted 200, is depicted in FIG. 2.

By way of example, coolant distribution unit 200 includes a single, large computer room water conditioning unit (CR-WCU) 210, which distributes conditioned chilled water to the various electronics racks 220 of a data center to be cooled. Conventionally, the electronics racks include memory frames, processor frames, input/output frames, power frames, etc. Operationally, the CRWCU 210 receives customer chilled water which is then used to supply conditioned cooled water to the individual electronics racks of the computer room.

More particularly, the CRWCU 210 includes a primary cooling loop wherein building chilled water is supplied and passed through a control valve which determines an amount of building chilled water to be passed through a heat exchanger, with a portion of the building chilled water possibly being returned directly to the return via a bypass valve. The CRWCU further includes a second cooling loop with a reservoir tank from which water is pumped into the heat exchanger for conditioning and output therefrom as a conditioned water source to the electronics racks 220 to be cooled within the computer room. The computer room water conditioning unit is conventionally separate from the electronics frames, and supplies system water (typically maintained at about 18-22° C.) to all electronics frames of the data center.

Figure 2:
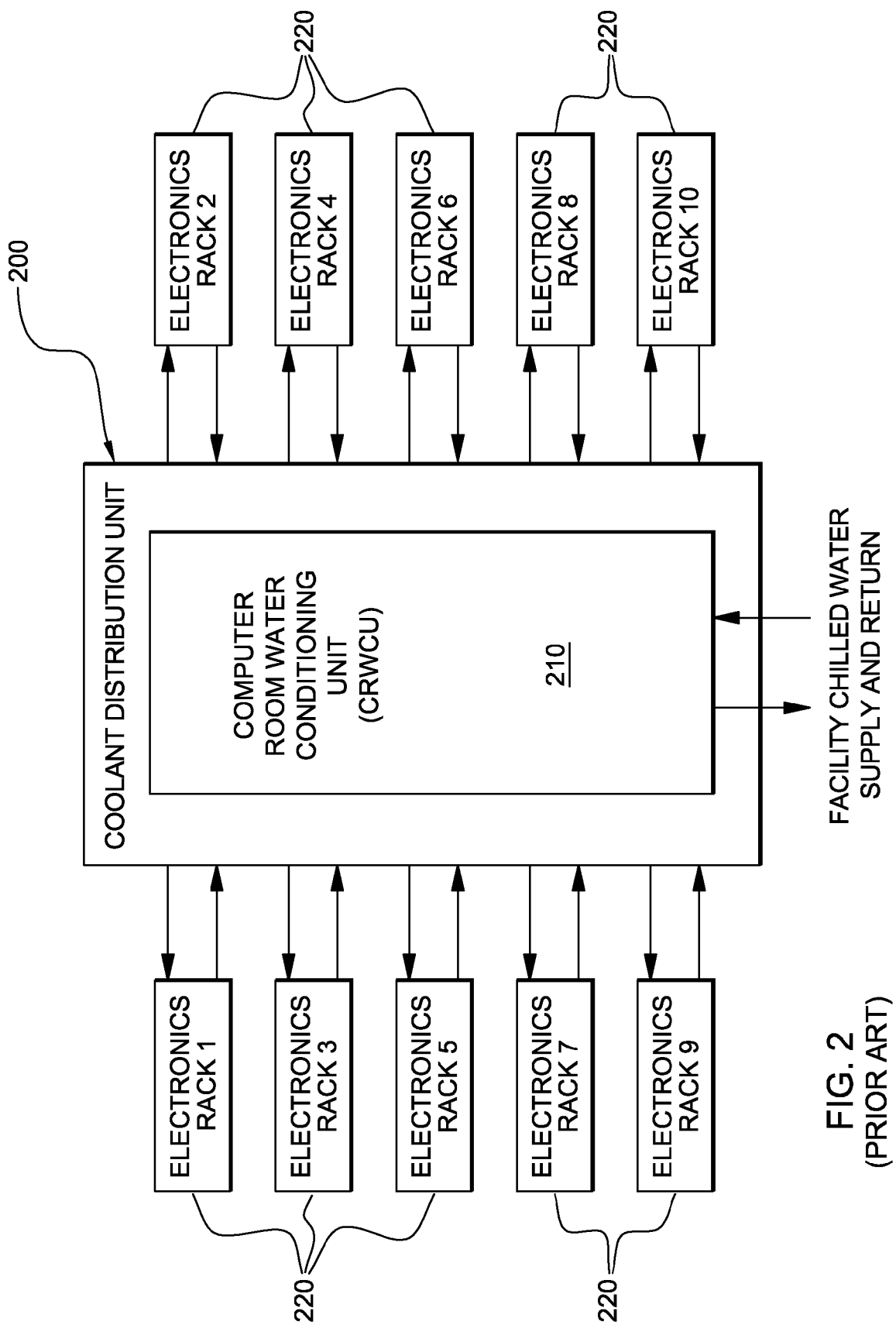
FIG. 2 depicts a conventional coolant distribution unit for a liquid-cooled data center.

In the liquid-cooled data center example of FIG. 2, the facility or building chilled water supply and return are part of the facility coolant loop. Although not shown in FIGS. 1 & 2, the portions of the facility coolant loops depicted might be (in one embodiment) in fluid communication with a facility cooling unit which is in communication with an air-cooled cooling tower, which includes a liquid-to-air heat exchanger for expelling thermal energy from the coolant within the heat dissipation coolant loop(s) to the surrounding environment.

Figure 3:
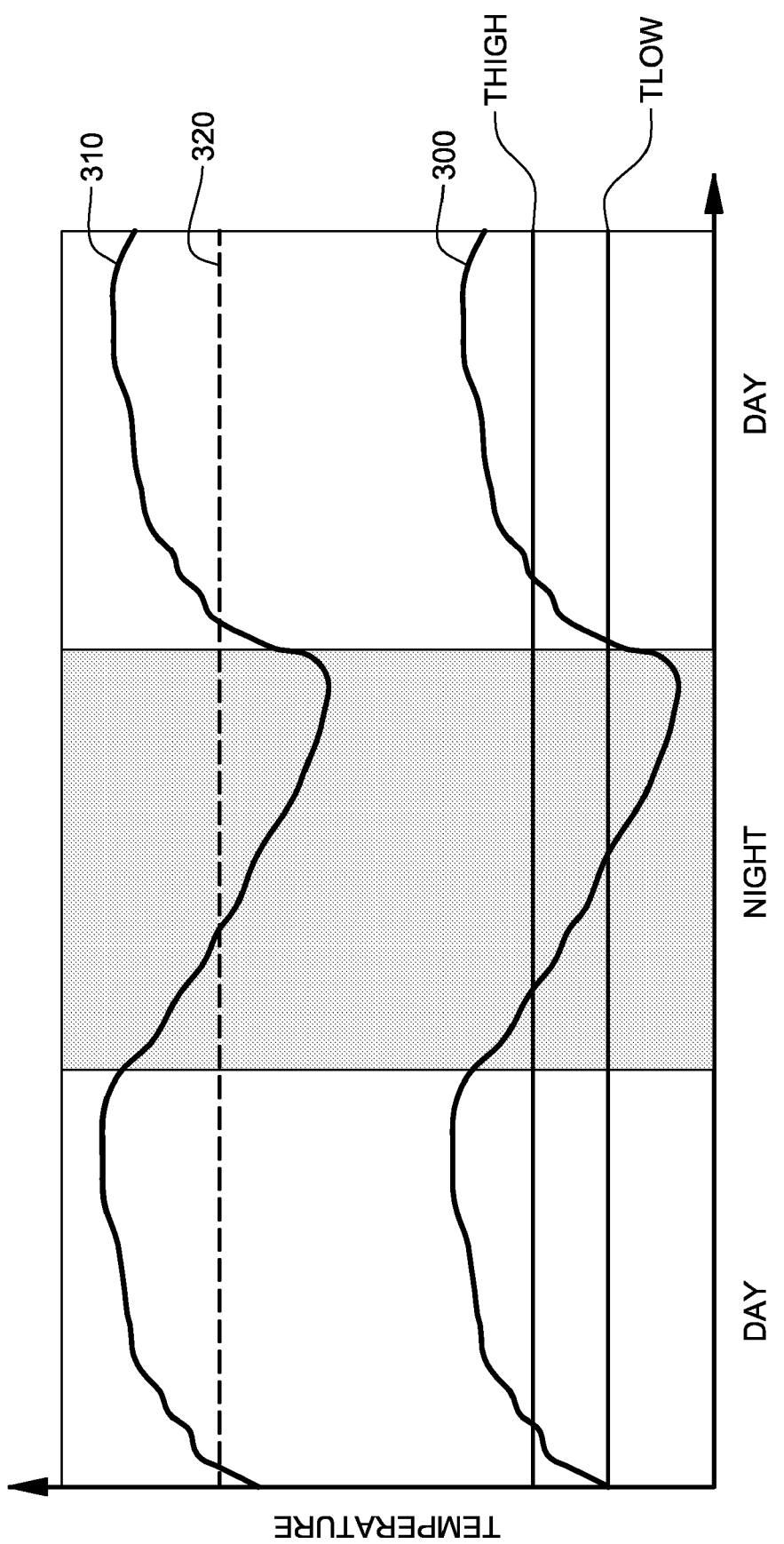
FIG. 3 is a graph illustrating coolant temperature variation within a heat dissipation coolant loop compared with ambient temperature variation about a cooling tower in fluid communication with the heat dissipation coolant loop, and illustrating a constant coolant temperature within the heat dissipation coolant loop when a thermal capacitor unit is in fluid communication therewith, in accordance with an aspect of the present invention.

FIG. 3 graphically illustrates coolant temperature 310 variation within a heat dissipation coolant loop compared with ambient temperature variation 300 about a cooling tower in fluid communication with the heat dissipation coolant loop. As shown, irrespective of facility cooling load variation during the day, the ambient temperature (i.e., the cooling tower's sink temperature) typically rises to a maximum during the daytime and then gradually declines at nighttime. Similarly, at nighttime, the ambient temperature about the cooling tower typically declines until some minimum is reached, and then increases as the sun rises. This variation in ambient temperature about the cooling tower results in a changing cooling system efficiency. When ambient temperature about the cooling tower is low, the difference between coolant temperature within the facility coolant loop and the ambient temperature is small, and this results in more efficient refrigeration by the facility cooling unit. However, when ambient temperature about the cooling tower is high, there is a larger temperature difference between the ambient temperature about the cooling tower and the coolant temperature within the facility coolant loop, which results in a higher condenser temperature requiring more work to be done, and thus results in a more inefficient heat transfer and a higher coolant temperature within the heat dissipation coolant loop. This situation is aggravated by the fact that the cooling tower duty (or the cooling load required) is typically higher during the daytime hours, since air-conditioning needs are typically greater during the day. As shown in the figure, by including a thermal capacitor unit in fluid communication with the heat dissipation coolant loop, it is possible to make the coolant temperature 320 within the heat dissipation coolant loop more constant, thus increasing the overall efficiency of the cooling system.

The significant influence of ambient temperature on the performance of a refrigeration system can be illustrated by exploring an idealized reversible Carnot refrigeration cycle. As is well known in thermodynamics, one way to express a measure of cycle efficiency is coefficient of performance (COP). By definition, in a refrigeration cycle the COP is calculated as: COP=$1/(Q\_h/Q\_l-1)$, where $Q\_h$ is the heat rate expelled on the condenser side to the ultimate sink (in this case ambient) and $Q\_l$ is the heat rate being absorbed by the evaporator. If it is assumed that the cooling tower and the heat dissipation loop of the data center both transfer heat from and to (respectively) the condenser and evaporator of the refrigeration system with perfect efficiency, and that the refrigeration system itself is a reversible (ideal) Carnot refrigerator, then the calculation can be expressed: COP=$1/(T\_h/T\_l-1)$ where $T\_h$ is the temperature of the condenser side ambient and $T\_l$ is the temperature of the evaporator. Taking an example from the southwest United States, the daytime peak temperature may be as high as 49°C. (322 K), and the night time temperature may be as low as 16° C. (289 K). In this example, assuming that the data center load is constant and that the facility requires 10° C (283 K) coolant, it is apparent that the maximum possible COP of the system during daytime is 7.3, while at night the maximum possible COP is 47.2. COP can be interpreted as the amount of cooling done on the load divided by the power required by the system to provide that cooling. The example system consumes 1 W for every 7.3 W cooled during the day, and 1W for every 47.2 W cooled during the night. This clearly demonstrates that if heat is stored during the day for subsequent cooling at night, significant energy savings could be achieved.

As a specific example, the coolant within the heat dissipation coolant loop is water, and the cooling tower functions as an evaporator, with the heat dissipation coolant loop passing through a condenser of a refrigeration-based facility cooling unit, as described further below with reference to FIG. 4.

Figure 4:
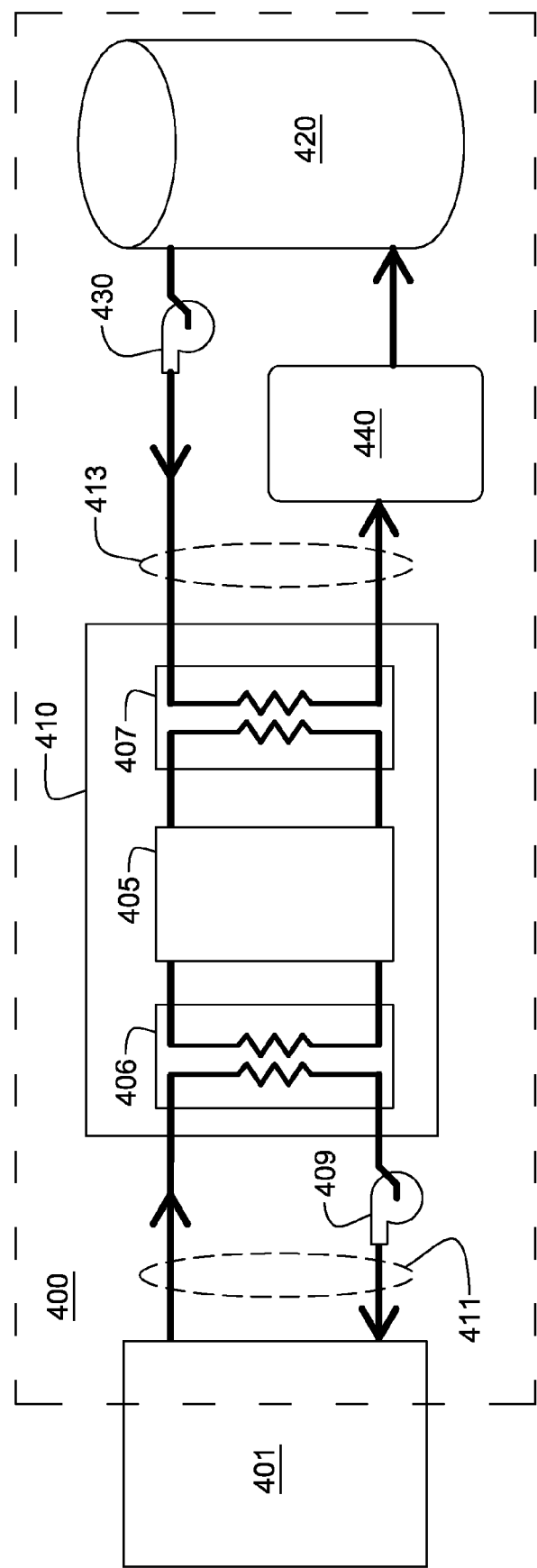
FIG. 4 depicts one embodiment of a cooling system employing a passive thermal capacitor unit, in accordance with an aspect of the present invention.

FIG. 4 depicts one embodiment of a cooling system 400 for, for example, liquid-cooling a data center 401. Cooling system 400 includes a facility cooling unit 410 (comprising a refrigeration system 405, an evaporator 406, and a condenser 407), a facility coolant loop 411 and a heat dissipation coolant loop 413. Thermal energy is extracted from the data center via, for example, one or more coolant distribution units (not shown) disposed within the data center, and transferred via facility coolant pump 409 through the facility coolant loop 411 to facility cooling unit 410. Evaporator 406 absorbs heat from the facility coolant within facility coolant loop 411 and this heat is pumped via refrigeration system 405 to condenser 407, where it is ejected to coolant passing through heat dissipation coolant loop 413. As shown, heat dissipation coolant loop 413 is in fluid communication with a cooling tower 420, which includes (in one embodiment) a liquid-to-air heat exchanger for extracting thermal energy from the coolant passing through the heat dissipation coolant loop 413 to the surrounding environment (e.g., to outdoor air), and a coolant circulation pump 430 circulates coolant through the heat dissipation coolant loop.

In this embodiment, one or more passive thermal capacitor units 440 are in fluid communication with the heat dissipation coolant loop between a coolant outlet of facility cooling unit 410 and a coolant inlet of cooling tower 420. As a specific operational example, the facility cooling unit provides chilled facility water to the data center. The chilled facility water is circulated and collects thermal energy from various heat exchangers, cold plates, air-conditioners, etc. disposed within the data center (or more generally the facility). Warm facility water is then returned to the facility cooling unit or chiller, which as noted, in one example, is a refrigeration system. The refrigeration system acts as a heat pump, moving thermal energy from the facility water to the coolant within the heat dissipation coolant loop (such as a water-based, two-phase coolant), which is also referred to herein as the condenser water. Hot condenser water flows through the one or more thermal capacitor units 440 and into the cooling tower, where it is cooled by the ambient temperature of the surrounding environment. The cooled condenser water is then circulated back to the facility cooling unit. Assuming a constant load, the cooling tower requires a constant temperature different to dissipate that load. Thus, as the ambient temperature increases, the condenser water temperature rises to expel the required heat load to the surroundings. This increased condenser water temperature (i.e., coolant temperature within the heat dissipation coolant loop 413) causes activation of the thermal capacitor unit.

By way of example, the passive thermal capacitor unit comprises a phase change material. When the coolant temperature is sufficiently high (e.g., above a selected melting/freezing temperature threshold), the phase change material melts. This phase change material is chosen to have a latent heat of fusion between the minimum and maximum condenser water temperatures. When coolant temperature rises above the threshold temperature, heat from the condenser water is absorbed by the phase change material as latent heat, resulting in melting of the material, reducing the load on the cooling tower. At nighttime, when the ambient temperature is low, the condenser water system temperature decreases until the freezing point of the phase change material is reached. At this point, the phase change material solidifies, releasing its stored latent heat into the condenser water, increasing the load on the cooling tower. As an alternative embodiment, the phase change material could be replaced with another material, for example, a liquid with a high specific heat, such as water. This process would then utilize sensible heating only to store and release energy.

Properties of two candidate phase change materials which may be employed are set forth in Table 1 below.

TABLE 1

| | Thermal conductivity, K, W/mK | Specific heat, $C_p$, J/kg-K | Density, $\rho$, kg/m$^3$ | Heat of fusion, $\Delta$H, J/L |
|---|---|---|---|---|
| Paraffin wax (RT27) $T_m$ = 29° C. | 0.2 (liquid) | 1800 (solid) 2400 (liquid) | 880 (solid) 760 (liquid) | 131,000 |

TABLE 1-continued

| | Thermal conductivity, K, W/mK | Specific heat, $C_p$, J/kg-K | Density, $\rho$, kg/m$^3$ | Heat of fusion, $\Delta$H, J/L |
|---|---|---|---|---|
| Eutectic salt (TH29) $T_m = 29°$ C. | 1.09 (solid) 0.54 (liquid) | 1600 (solid) 2400 (liquid) | 1620 (solid) 1510 (liquid) | 284,400 |

In one embodiment, the one or more thermal capacitor units 440 may comprise one or more modular thermal capacitor units.

Figure 5A:
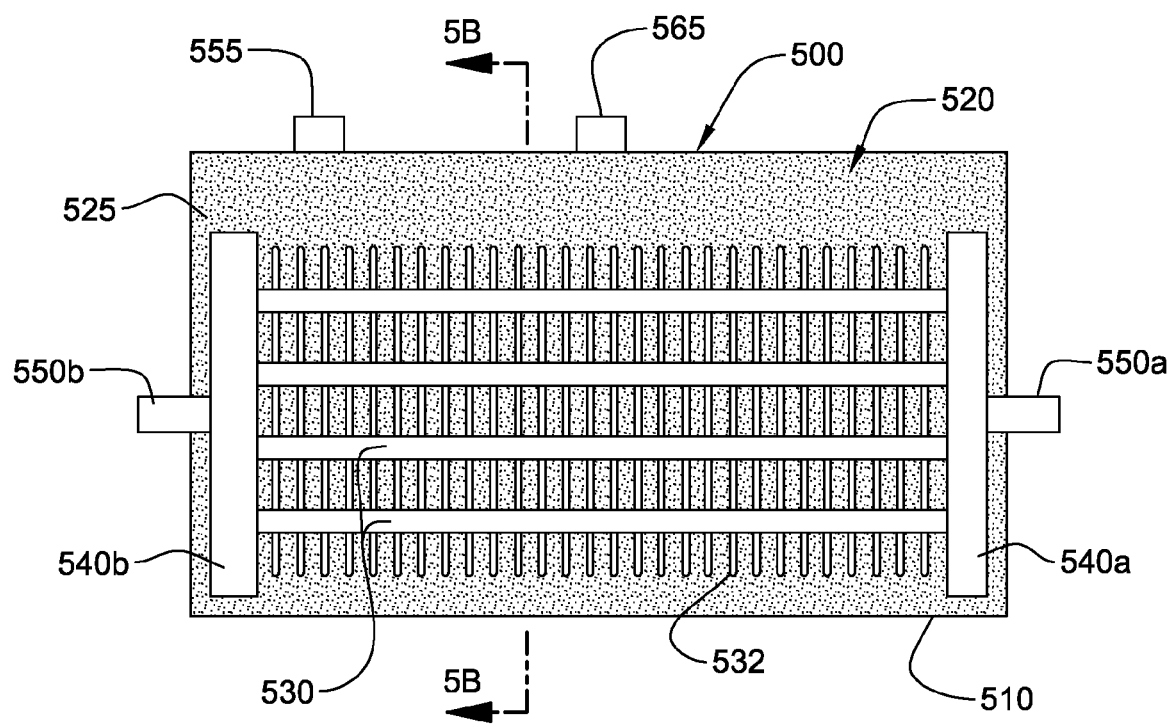
FIG. 5A is a cross-sectional view of one embodiment of a thermal capacitor unit, taken along line A-A of FIG. 5B, in accordance with an aspect of the present invention.
Figure 5B:
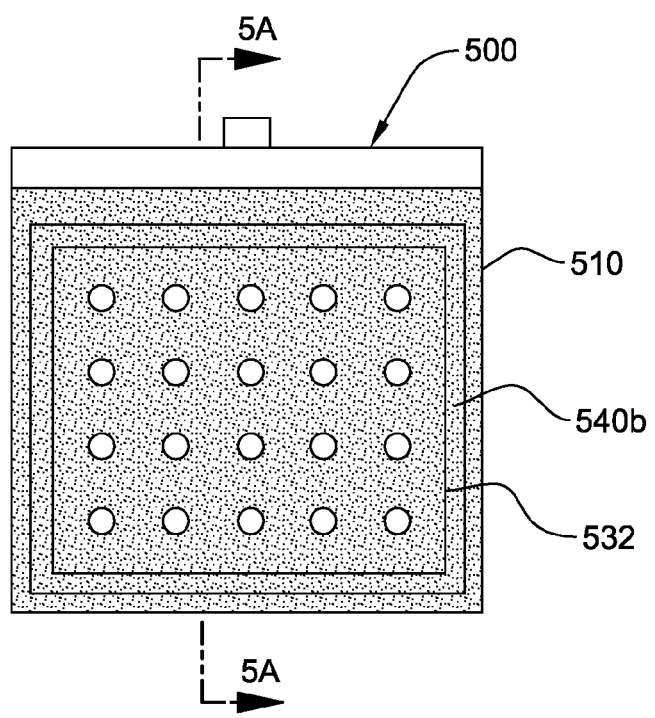
FIG. 5B is a cross-sectional view of the thermal capacitor unit embodiment of FIG. 5A, taken along line B-B of FIG. 5A, in accordance with an aspect of the present invention.

One embodiment of a modular thermal capacitor unit 500, in accordance with an aspect of the present invention, is shown in FIGS. 5A & 5B. In this embodiment, thermal capacitor unit 500 comprises a sealed container or housing 510 with an inner chamber 520 which contains a phase change material 525. A plurality of coolant flow tubes 530 pass through chamber 520 between an inlet plenum 540a and an outlet plenum 540b. When the thermal capacitor unit is inserted into the heat dissipation coolant loop between, for example, a facility cooling unit and a cooling tower, coolant is received into the inlet plenum through coolant inlet 550a, passes through the coolant flow tubes to the outlet plenum, and is returned to the coolant loop through a coolant outlet 550b. The plurality of coolant flow tubes have a plurality of thermal conduction fins 532 extending therefrom. Fins 532 serve to increase the surface area in contact with the phase change material. In one embodiment, the plurality of thermal conduction fins may comprise thermally conductive plate fins surrounding the coolant flow tubes. One thermally conductive plate fin 532 is shown in FIG. 5B.

Phase change material 525 surrounds the plurality of coolant flow tubes 530 and the plurality of thermal conduction fins 532. Phase change material 525 is a low melting point phase change material, such as TH29 available from PCM Thermal Solutions of Naperville, Ill. Material TH29 has a melting point of 29° C. Should the heat load raise the water temperature to above the melting point of the phase change material, then heat from the water will be absorbed into the phase change material as latent heat due to melting of the material. The temperature of the water leaving the TCU will remain at a level near the melting point of the phase change material during this process. By appropriately sizing the amount of phase change material, a defined period of time (e.g., approximately 4-6 hours) can be provided to address ambient temperature variation about the cooling tower. Advantageously, the thermal capacitor unit(s) in this embodiment is totally passive, not requiring any sensor or active control to bring the units into operation.

Assembly of thermal capacitor unit 500 can be accomplished by placing an assembled heat exchange substructure comprising the plurality of coolant flow tubes, thermal conduction fins, inlet and outlet plenums, and system coolant inlet and outlet within a closed containment housing or chamber. Prior to filling the thermal capacitor unit with molten phase change material, the housing and heat exchange substructure are heated to a temperature above the melting point of the phase change material. Then a vacuum can be established on the inside of the containment housing via a vent port 555, i.e., to minimize voids within the phase change material, and the free volume within the containment housing is filled by pouring the molten phase change material through a fill port 565 into the chamber. An air pocket is left at the top of the chamber so that as the phase change material melts, there is no potential for an excessive hydrostatic pressure to develop. The chamber is sealed and the thermal capacitor unit is allowed to cool, thereby solidifying the phase change material.

Figure 6:
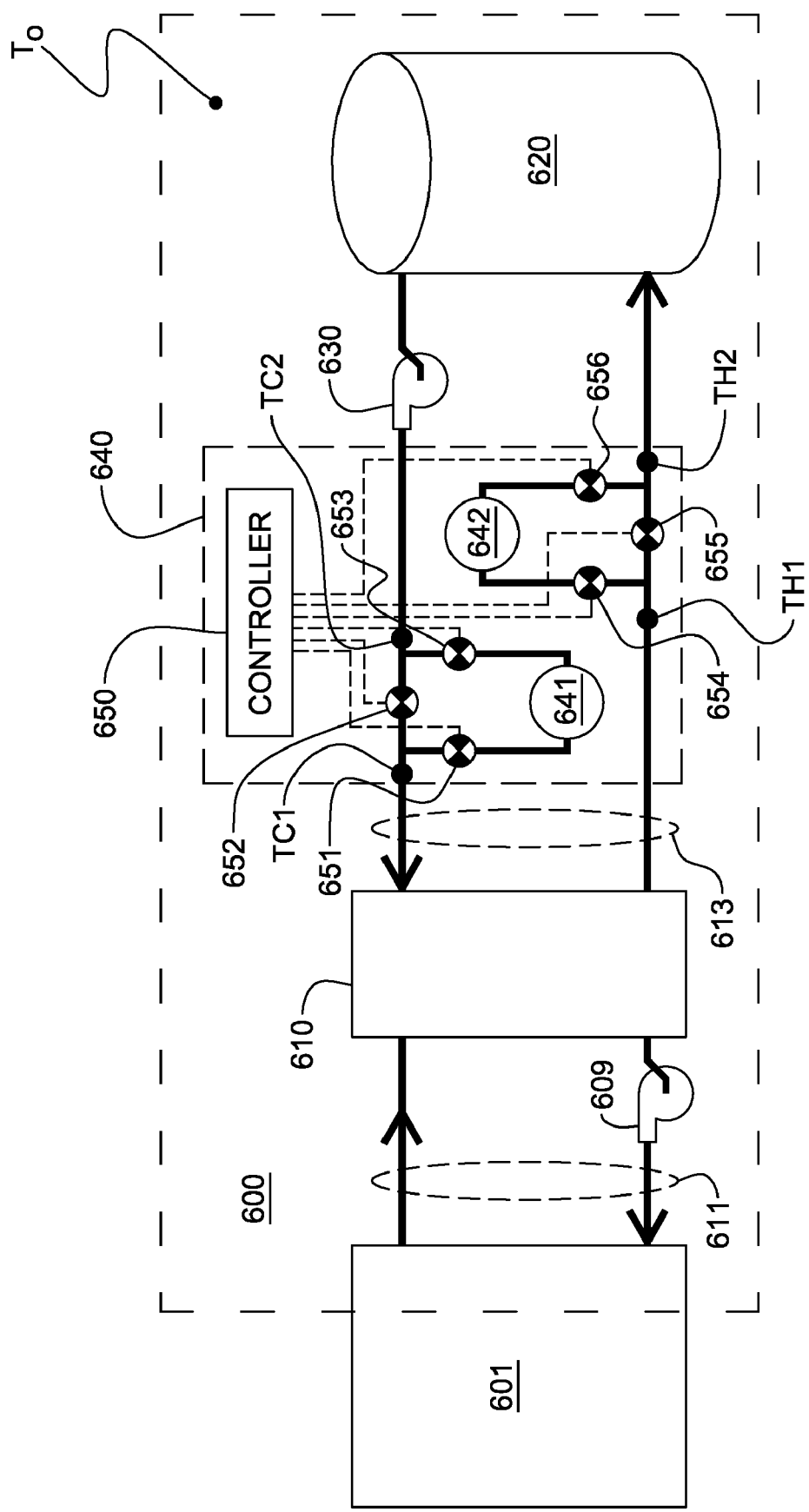
FIG. 6 depicts one embodiment of a cooling system employing an actively controlled thermal capacitor unit, in accordance with an aspect of the present invention.

FIG. 6 depicts an alternate embodiment of a cooling system, generally denoted 600, for implementing a liquid-cooled data center. This cooling system again includes a facility coolant loop 611, one or more facility cooling units 610, a refrigeration system, evaporator and condenser (such as described above in connection with FIG. 4), and a heat dissipation coolant loop 613. The heat dissipation coolant loop 613 connects facility coolant unit 610 in fluid communication with a liquid-to-air cooling tower 620. A coolant pump 609 circulates coolant through facility coolant loop 611, while a coolant pump 630 circulates coolant through heat dissipation coolant loop 613.

In this embodiment, an active thermal capacitor unit 640 is illustrated. The active thermal capacitor unit 640 includes a cold coolant storage unit 641 and a hot coolant storage unit 642, both of which may be controllably coupled into the heat dissipation coolant loop 613 by a controller 650. As illustrated, the cold coolant storage unit 641 is controllably coupled into the heat dissipation coolant loop 613 between a coolant outlet of cooling tower 620 and a coolant inlet of the condenser of the facility cooling unit. The hot coolant storage unit 642 is controllably coupled into the heat dissipation coolant loop 613 between the coolant outlet of facility cooling system 610 and the coolant inlet of coolant tower 620. More particularly, controller 650 is coupled to a plurality of valves 651, 652, 653, 654, 655, 656 for automatically controlling the timing and amount of coolant diversion either from or into cold coolant storage unit 641 and hot coolant storage unit 642. Additionally, controller 650 is coupled to a plurality of temperature sensors TC1, TC2, $T_0$, TH1 & TH2 for monitoring the temperature of coolant within heat dissipation coolant loop 613, as well as the ambient temperature, as explained further below.

As a specific example, coolant within the heat dissipation coolant loop is again assumed to be a water-based, two-phase coolant. During daytime, when ambient temperature about cooling tower 620 is the warmest, warm water is pumped into the hot coolant storage unit 642 and cold water is released from the cold coolant storage unit 641. To fill the hot coolant storage unit, valves 654, 656 are opened and valve 655 is gradually shut to force the hot water to run through or into the hot coolant storage unit. Once the hot water storage unit temperature has risen to the temperature of the water in the heat dissipation coolant loop between the coolant outlet of the facility cooling system 610 and the coolant inlet of cooling tower 620, valve 655 is automatically opened and valves 654, 656 are automatically shut by controller 650. To release cold water from the cold coolant storage unit 641, valves 651, 653 are opened and valve 652 is gradually shut. During nighttime, when ambient temperature about the cooling tower is lowest, cool water is placed into cold coolant storage unit 641 and hot water is released from hot coolant storage unit 642 using the same procedure. Note that in this scenario, it is not feasible to construct tanks large enough to fully buffer the daily temperature swing. If this were possible, then the valves 651 . . . 656 would be unnecessary. To optimize system performance using smaller tanks, the controller only fills the hot coolant storage unit during a period of time representing the highest ambient temperature about the cooling tower, and releases water from the cold coolant storage unit at this time also. Conversely, the controller only fills cold coolant storage unit during the coldest part of the day, at the same time that hot water is released from the hot coolant storage unit.

In one embodiment, a temperature sensor coupled to controller 650 could be employed, along with a first, upper temperature threshold and a second, lower temperature threshold to control when the active thermal capacitor unit stores thermal energy and releases thermal energy. For example, note that in the above example of FIG. 6, it is assumed that the cold coolant storage unit, hot coolant storage unit, and heat dissipation coolant loop are always full of coolant, e.g., water. In this case, it is possible to eliminate one of the control valves associated with each tank. For example, valve 651 or 653 may not be necessary for the cold coolant storage unit, and valve 654 or 656 could be removed from the hot coolant storage unit without sacrificing function.

Figure 7A:
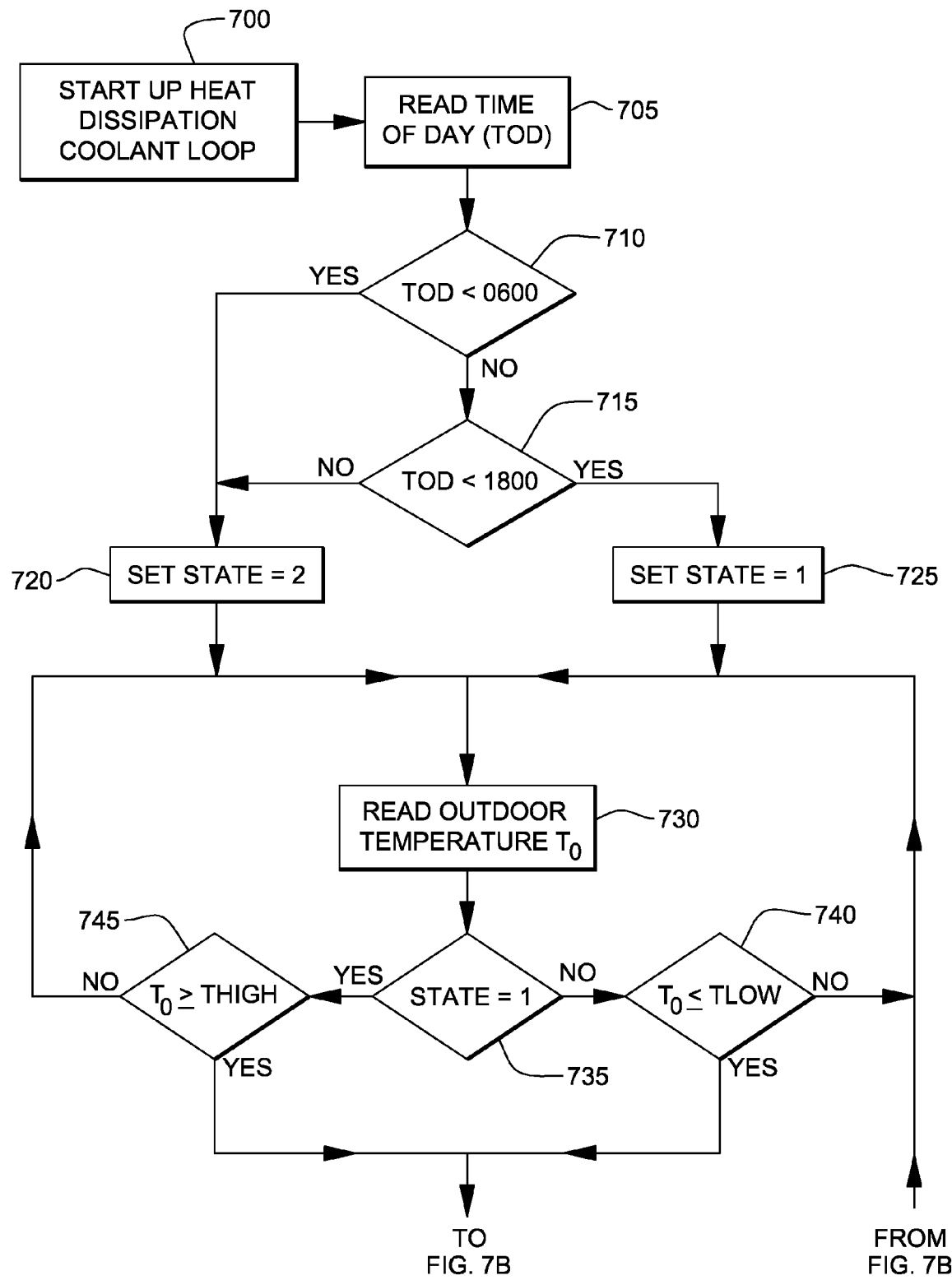
FIGS. 7A & 7B are a flowchart of one embodiment of control processing implemented by the controller of the cooling system embodiment of FIG. 6, in accordance with an aspect of the present invention.
Figure 7B:
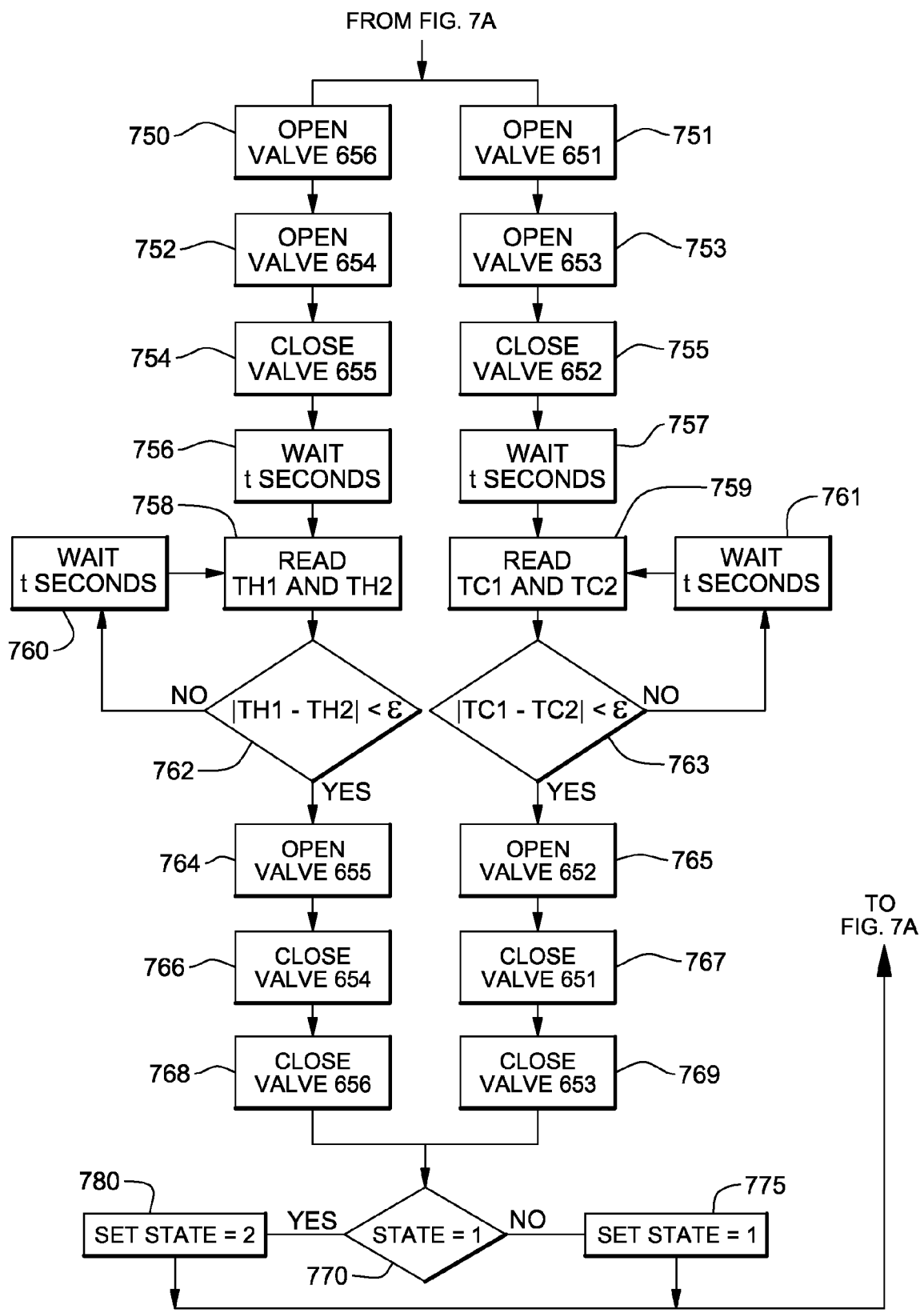

FIGS. 7A & 7B are a flowchart of one embodiment of logic implemented by controller 650 of FIG. 6. As shown in FIG. 6, temperature sensors TH1 and TH2 are on the hot side of the heat dissipation coolant loop 613, while temperature sensors TC1 & TC2 are on the cold side of the heat dissipation coolant loop. Outdoor ambient temperature sensor $T_O$ is disposed in the vicinity of cooling tower 620. Within this implementation, and with reference to FIGS. 6-7B, the controller logic begins with startup of the heat dissipation coolant loop 700, e.g., with powering of controller 650 and coolant pump 630. Controller 650 then reads the time of day 705 and determines whether the time of day is less than 0600 hours, that is, is a nighttime period 710. If "yes", then a state indicator is set to '2' 720. If the startup time of day is after 1800 hours 715, then the state indicator is again set to state '2' 720. Otherwise, when the startup time of day is between 0600 hours and 1800 hours (daytime period), the state indicator is set to state '1' 725.

The outdoor temperature is sensed using temperature sensor $T_O$ 730, and processing determines whether the state indicator is set to '1' 735, and if so, the outdoor temperature from sensor $T_O$ is compared to a programmed high temperature threshold (i.e., THIGH (FIG. 3)). If the state indicator is state '2', then the outdoor temperature reading for sensor $T_O$ is compared to a programmed low temperature threshold (i.e., TLOW). If in state '1', and $T_O$ is greater than the high threshold level, or in state '2' and $T_O$ is less than the low threshold level, then a liquid exchange operation is initiated to displace coolant in the hot and cold storage tanks 642, 641, respectively, with coolant from the active portion of the heat dissipation coolant loop 613. If the inequality conditions are not satisfied, processing loops back to read the outdoor temperature, either with or without a time delay (not shown), until the pertinent inequality condition is satisfied.

Once satisfied, and continuing with the processing of FIG. 7B, the liquid exchange operation is initiated in parallel for both the hot and cold storage tanks. Beginning with the hot side of the heat dissipation coolant loop, valves 656 & 654 are opened, and valve 655 is then closed (750, 752 & 754), allowing coolant in the hot side of the coolant dissipation coolant loop to flow into storage tank 642, displacing coolant stored in the tank into the active portion (i.e., coolant lines, coolant tower and condenser) of the loop. Similarly, on the cold side of the heat dissipation coolant loop, valves 651 & 653 are opened, after which valve 652 is closed (751, 753 & 755).

Prior to introducing coolant from the active loop into the storage tanks, temperature sensors TH1 & TH2 will be at the same temperature, and temperature sensors TC1 & TC2 will be at the same temperature. Following initiation of the liquid exchange operation, the controller waits a short period of t seconds, before reading the temperatures TH1 and TH2, as well as TC1 and TC2 (756 & 758, 757 & 759). During this period, the temperature at TH2 will start to increase as hot coolant is displaced from the hot storage tank 642 and the temperature at TH1 will remain the same or may even decrease due to the simultaneous release of cold coolant from the cold coolant storage tank. Following the wait period, a reading is taken from temperature sensors TH1, TH2, TC1 and TC2. The absolute value of the difference between TH1 and TH2, as well as the absolute value of the difference between TC1 and TC2 are compared with a reference value $\epsilon$ to determine if all the coolant in the hot and cold storage tanks has been displaced by coolant from the heat dissipation coolant loop 613. As this happens, temperature TH1 approaches temperature TH2, and the absolute value of the difference between TH1 and TH2 drops below $\epsilon$ (which for a typical value is 1 Centigrade degree). Until this happens, the cycle of waiting 760, 761, reading 758, 759 and comparing 762, 763 is repeated. Following completion of the liquid exchange operation, on the hot side of the coolant loop value 655 is opened, and valves 654 & 656 are closed (764, 766, 768), causing coolant from the hot side of the heat dissipation coolant loop to return to normal, that is, bypassing the hot storage tank. Similarly, completion of the liquid exchange operation on the cold side of loop 613 results in valve 652 being opened, and valves 651, 653 being closed (765, 767, 769).

After completing the liquid exchange operation and returning the heat dissipation coolant loop to the normal cooling mode, the control algorithm checks whether state condition is '1' or '2' 770, and whichever state condition exists, that condition is reset to the opposite state 775, 780, and logic returns to the flow of FIG. 7A to read the outdoor temperature $T_O$. This last operation of switching states ensures that only one liquid exchange operation can occur during daytime hours, and only one liquid exchange operation occurs during nighttime hours.

In an alternative embodiment, the system of FIG. 6 could include all of the valves shown, and could additionally include a vent to the surroundings from each storage unit, then the system would include only enough water to fill one storage unit, and the heat transfer coolant loop. During daytime hours, the system would start with cold water in the cold coolant storage unit and an empty hot coolant storage unit. As the ambient temperature increases, the cool water is released from the cold coolant storage unit, being replaced with air, and simultaneously, hot water begins to fill the hot coolant storage unit. At nighttime, the process would be reversed. Further, note that in most implementations, it is desirable that the storage units, or with respect to the embodiment of FIG. 4, the phase change material, be insulated.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
   at least one facility cooling unit, the at least one facility coolant unit comprising a heat dissipation coolant loop, wherein facility thermal energy is extracted by the at least one facility cooling unit and expelled to coolant of the heat dissipation coolant loop;
   a cooling tower in fluid communication with the heat dissipation coolant loop, the cooling tower comprising a liquid-to-air heat exchanger for expelling thermal energy from coolant of the heat dissipation coolant loop to the surrounding environment;
   at least one thermal capacitor unit controllably in fluid communication with coolant of the heat dissipation coolant loop to facilitate efficient thermal energy transfer from the coolant of the heat dissipation coolant loop to the surrounding environment with variation in ambient temperature about the cooling tower, the at least one thermal capacitor unit comprising at least one actively controlled thermal capacitor unit controllably in fluid communication with the coolant of the heat dissipation coolant loop to either pass coolant of the heat dissipation loop through the at least one actively controlled thermal capacitor unit or to bypass the at least one actively controlled thermal capacitor unit, and wherein the at least one actively controlled thermal capacitor unit comprises at least one cold coolant storage unit and at least one hot coolant storage unit, the at least one cold coolant storage unit being controllably in fluid communication with the heat dissipation coolant loop between a coolant outlet of the cooling tower and a coolant inlet of the at least one facility cooling unit, and the at least one hot coolant storage unit being controllably in fluid communication with the heat dissipation coolant loop between a coolant outlet of the at least one facility cooling unit and a coolant inlet of the cooling tower.

2. The cooling system of claim 1, wherein the at least one thermal capacitor unit facilitates maintaining coolant temperature of the heat dissipation coolant loop within a defined range for a period of time with variation in ambient temperature about the cooling tower, and wherein the at least one thermal capacitor unit enhances energy efficiency of the cooling system by storing thermal energy during daytime and dissipating the stored thermal energy during nighttime when daytime ambient temperature about the cooling tower is greater than nighttime ambient temperature about the cooling tower.

3. The cooling system of claim 1, wherein during a period of high ambient temperature about the cooling tower, coolant is automatically diverted from the heat dissipation coolant loop into the at least one hot coolant storage unit and from the at least one cold coolant storage unit into the heat dissipation coolant loop, and during a period of low ambient temperature, coolant is automatically diverted from the at least one hot coolant storage unit into the heat dissipation coolant loop and from the heat dissipation coolant loop into the at least one cold coolant storage unit, thereby enhancing cooling tower efficiency.

4. The cooling system of claim 3, wherein during a period of high ambient temperature about the cooling tower, coolant of the heat dissipation coolant loop is automatically diverted into the at least one hot coolant storage unit until coolant temperature within the at least one hot coolant storage unit reaches coolant temperature within the heat dissipation coolant loop between the coolant outlet of the at least one facility cooling unit and the coolant inlet of the cooling tower, and wherein coolant outflow from the at least one cold coolant storage unit is automatically discontinued commensurate with discontinuing coolant inflow into the at least one hot coolant storage unit.

5. The cooling system of claim 3, wherein coolant of the heat dissipation coolant loop is automatically diverted into the at least one hot coolant storage unit and from the at least one cold coolant storage unit when ambient temperature about the cooling tower is above a first threshold temperature, and coolant is automatically diverted from the at least one hot coolant storage unit and into the at least one cold coolant storage unit when ambient temperature about the cooling tower is below a second threshold temperature, wherein the first threshold temperature is greater than the second threshold temperature.

6. The cooling system of claim 1, wherein a facility comprises a data center with at least one electronics rack, and the at least one facility cooling unit further comprises a facility coolant loop and a liquid-to-liquid heat exchanger, the facility coolant loop providing facility coolant to the data center and expelling thermal energy from the data center in the liquid-to-liquid heat exchanger to the coolant of the heat dissipation coolant loop, wherein the facility coolant facilitates cooling the at least one electronics rack of the data center.

7. A cooled electronics system comprising:
at least one electronics rack comprising at least one electronics unit; and
a cooling system comprising:
at least one facility cooling unit, the at least one facility cooling unit comprising a heat dissipation coolant loop, wherein the at least one facility cooling unit facilitates extracting thermal energy from the at least one electronics unit of the at least one electronics rack and expels the extracted thermal energy to coolant of the heat dissipation coolant loop;
a cooling tower in fluid communication with the heat dissipation coolant loop, the cooling tower comprising a liquid-to-air heat exchanger for expelling thermal energy from the coolant of the heat dissipation coolant loop to the surrounding environment;
at least one thermal capacitor unit controllably in fluid communication with coolant of the heat dissipation coolant loop to facilitate efficient thermal energy transfer from the coolant of the heat dissipation loop to the surrounding environment with variation in ambient temperature about the cooling tower, the at least one thermal capacitor unit comprising at least one actively controlled thermal capacitor unit controllably in fluid communication with the coolant of the heat dissipation coolant loop to either pass coolant of the heat dissipation loop through the at least one actively controlled thermal capacitor unit or to bypass the at least one actively controlled thermal capacitor unit; and wherein the at least one actively controlled thermal capacitor unit comprises at least one cold coolant storage unit and at least one hot coolant storage unit, the at least one cold coolant storage unit being controllably in fluid communication with the heat dissipation coolant loop between a coolant outlet of the cooling tower and a coolant inlet of the at least one facility cooling unit, and the at least one hot coolant storage unit being controllably in fluid communication with the heat dissipation coolant loop between a coolant outlet of the at least one facility cooling unit and a coolant inlet of the cooling tower.

8. The cooled electronics system of claim 7, wherein the at least one thermal capacitor unit facilitates maintaining coolant temperature of the heat dissipation coolant loop within a defined range for a period of time with variation in ambient temperature about the cooling tower, and wherein the at least one thermal capacitor unit enhances energy efficiency of the cooling system by storing thermal energy during daytime and dissipating the stored thermal energy during nighttime when daytime ambient temperature about the cooling tower is greater than nighttime ambient temperature about the cooling tower.

9. The cooled electronics system of claim 7, wherein during a period of high ambient temperature about the cooling tower, coolant is automatically diverted from the heat dissipation coolant loop into the at least one hot coolant storage unit and from the at least one cold coolant storage unit into the heat dissipation coolant loop, and during a period of low ambient temperature, coolant is automatically diverted from the at least one hot coolant storage unit into the heat dissipation coolant loop and from the heat dissipation coolant loop into the at least one cold coolant storage unit, thereby enhancing cooling tower efficiency.

10. The cooled electronic system of claim 9, wherein during a period of high ambient temperature about the cooling tower, coolant of the heat dissipation coolant loop is automatically diverted into the at least one hot coolant storage unit until coolant temperature within the at least one hot coolant storage unit reaches coolant temperature within the heat dissipation coolant loop between the coolant outlet of the at least one facility cooling unit and the coolant inlet of the cooling tower, and wherein coolant outflow from the at least one cold coolant storage unit is automatically discontinued commensurate with discontinuing coolant inflow into the at least one hot coolant storage unit.

11. The cooled electronics system of claim 9, wherein coolant of the heat dissipation coolant loop is automatically diverted into the at least one hot coolant storage unit and from the at least one cold coolant storage unit when ambient temperature about the cooling tower is above a first threshold temperature, and coolant is automatically diverted from the at least one hot coolant storage unit and into the at least one cold coolant storage unit when ambient temperature about the cooling tower is below a second threshold temperature, wherein the first threshold temperature is greater than the second threshold temperature.

12. A method of cooling a facility comprising:
providing at least one facility cooling unit, the at least one facility cooling unit comprising a heat dissipation coolant loop, and wherein when in use, the at least one facility cooling unit extracts thermal energy from the facility and expels the thermal energy to coolant of the heat dissipation coolant loop;
providing a cooling tower in fluid communication with the heat dissipation coolant loop, the cooling tower comprising a liquid-to-air heat exchanger for expelling thermal energy from coolant of the heat dissipation coolant loop to the surrounding environment;
providing at least one thermal capacitor unit controllably in fluid communication with coolant of the heat dissipation coolant loop to facilitate efficient thermal energy transfer from the coolant of the heat dissipation coolant loop to the surrounding environment with variation in ambient temperature about the cooling tower, the at least one thermal capacitor unit comprising at least one actively controlled thermal capacitor unit controllably in fluid communication with the coolant of the heat dissipation coolant loop to either pass coolant of the heat dissipation loop through the at least one actively controlled thermal capacitor unit or to bypass the at least one actively controlled thermal capacitor unit, and
wherein the at least one actively controlled thermal capacitor unit comprises at least one cold coolant storage unit and at least one hot coolant storage unit, the at least one cold coolant storage being controllably in fluid communication with the heat dissipation coolant loop between a coolant outlet of the cooling tower and a coolant inlet of the at least one facility cooling unit, and the at least one hot coolant storage unit being controllably in fluid communication with the heat dissipation coolant loop between a coolant outlet of the at least one facility cooling unit and a coolant inlet of the cooling tower.

13. The method of claim 12, wherein the method further comprises during a period of high ambient temperature about the cooling tower, automatically diverting coolant from the heat dissipation coolant loop into the at least one hot coolant storage unit and from the at least one cold coolant storage unit into the heat dissipation coolant loop, and during a period of low ambient temperature, automatically diverting coolant from the at least one hot coolant storage unit into the heat dissipation coolant loop and from the heat dissipation coolant loop into the at least one cold coolant storage unit, thereby enhancing cooling tower efficiency.

14. The method of claim 13, wherein coolant of the heat dissipation coolant loop is automatically diverted into the at least one hot coolant storage unit and from the at least one cold coolant storage unit when ambient temperature about the cooling tower is above a first threshold temperature, and coolant is automatically diverted from the at least one hot coolant storage unit and into the at least one cold coolant storage unit when ambient temperature about the cooling tower is below a second threshold temperature, wherein the first threshold temperature is greater than the second threshold temperature.

* * * * *